(12) United States Patent
Huang et al.

(10) Patent No.: US 10,536,146 B2
(45) Date of Patent: Jan. 14, 2020

(54) EDGE DETECTOR CIRCUIT AND METHOD

(71) Applicant: TAIWAN SEMICONDUCTOR MANUFACTURING COMPANY, LTD., Hsinchu (TW)

(72) Inventors: Tsung-Ching (Jim) Huang, Mountain View, CA (US); Chan-Hong Chern, Palo Alto, CA (US); Ming-Chieh Huang, San Jose, CA (US); Chih-Chang Lin, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/415,918

(22) Filed: May 17, 2019

(65) Prior Publication Data

US 2019/0273500 A1 Sep. 5, 2019

Related U.S. Application Data

(60) Continuation of application No. 15/870,356, filed on Jan. 12, 2018, now Pat. No. 10,298,237, which is a continuation of application No. 15/049,919, filed on Feb. 22, 2016, now Pat. No. 9,871,521, which is a division of application No. 14/446,714, filed on Jul. 30, 2014, now Pat. No. 9,270,276.

(51) Int. Cl.
*H03K 5/22* (2006.01)
*H03K 19/0185* (2006.01)

(52) U.S. Cl.
CPC . *H03K 19/018507* (2013.01); *H03K 19/0185* (2013.01); *H03K 19/018521* (2013.01)

(58) Field of Classification Search
CPC ............ H03K 5/26; H03K 5/12; H03K 5/135; H03K 5/1534; H03K 19/12; H03K 19/018507; H03K 19/0185; H03K 19/018521
See application file for complete search history.

(56) References Cited

U.S. PATENT DOCUMENTS

| | | | |
|---|---|---|---|
| 6,255,888 B1 | 7/2001 | Satomi | |
| 6,359,493 B2 | 3/2002 | Satomi | |
| 6,414,517 B1 * | 7/2002 | Kim | H04L 25/0272 326/88 |
| 7,705,630 B1 | 4/2010 | Huang et al. | |
| 9,270,276 B1 | 2/2016 | Huang et al. | |
| 9,871,521 B2 | 1/2018 | Huang et al. | |
| 10,298,237 B2 * | 5/2019 | Huang | H03K 19/0185 |
| 2005/0040852 A1 | 2/2005 | Mentze et al. | |
| 2005/0040853 A1 | 2/2005 | Mentze et al. | |
| 2006/0125811 A1 | 6/2006 | Moon et al. | |
| 2015/0200669 A1 | 7/2015 | Cai | |
| 2018/0175841 A1 * | 6/2018 | Abesingha | H03K 5/14 |

* cited by examiner

*Primary Examiner* — Long Nguyen
(74) *Attorney, Agent, or Firm* — Hauptman Ham, LLP

(57) ABSTRACT

An edge detector includes an output node selectively coupled to a first voltage node through a first transistor, the first voltage node having a first voltage level, and a second transistor configured to continuously couple the output node to a second voltage node having a second voltage level. A capacitor includes a first terminal coupled to a gate of the first transistor and a second terminal configured to receive an input signal.

20 Claims, 6 Drawing Sheets

EDGE DETECTOR CIRCUIT AND METHOD

PRIORITY CLAIM

The present application is a continuation of U.S. application Ser. No. 15/870,356, filed Jan. 12, 2018, which is a continuation of U.S. application Ser. No. 15/049,919, filed Feb. 22, 2016, how U.S. Pat. No. 9,871,521, issue Jan. 16, 2018, which is a divisional of U.S. application Ser. No. 14/446,714, filed Jul. 30, 2014, now U.S. Pat. No. 9,270,276, issued Feb. 23, 2016, which are incorporated herein by reference in their entireties.

BACKGROUND

Level shifters are used to change a signal voltage level between the input/output (I/O) device voltage, e.g., 3.3V, to the core device voltage, e.g., 0.9V. In some approaches, the level shifters are formed using I/O devices. The I/O devices have a thicker gate dielectric layer in comparison with the core devices to withstand higher voltages.

In some approaches, the level shifters increase a voltage level of a logically high voltage from a first level to a second higher level. In some approaches, these level shifters do not increase a voltage level of a logically low voltage. The level shifters which maintain a same logically low voltage level increase a voltage swing of an output signal in comparison with an input signal. In some approaches, the level shifters include a bias circuit to increase the logically low voltage level.

In some approaches, the level shifters are formed using devices similar to the core devices. The core devices have a thinner gate dielectric than the I/O devices. As a result, a voltage swing which is able to damage the core devices has a smaller range with respect to the I/O devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
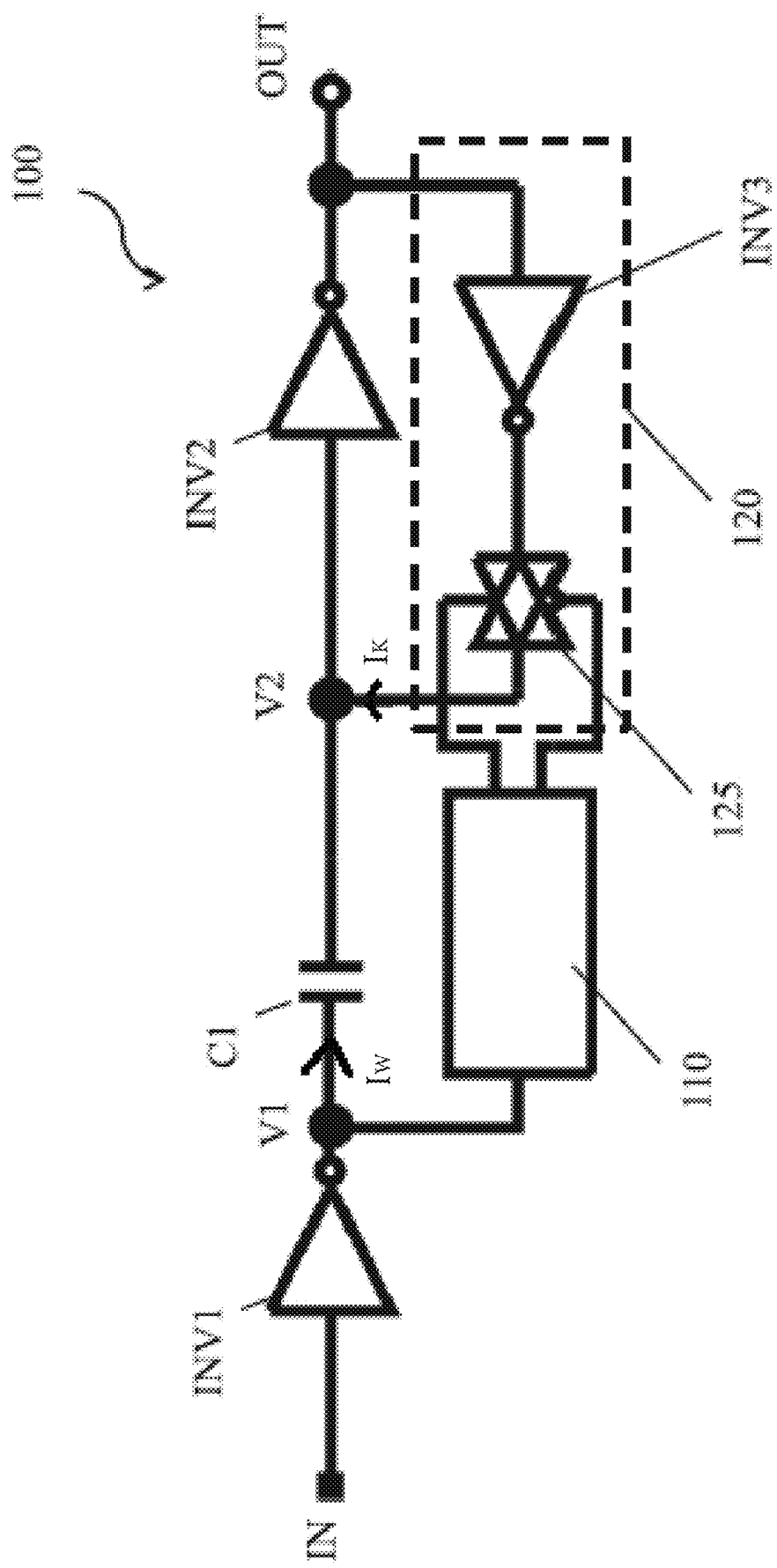
FIG. 1 is a schematic diagram of a level shifting apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of a level shifting apparatus 100 in accordance with some embodiments. Level shifting apparatus 100 includes an inverter INV1 configured to receive an input signal IN. A first side of a first capacitor C1 is connected to an output of inverter INV1. An edge detector 110 is also connected to the output of inverter INV1. A second side of first capacitor C1 is connected to an input of an inverter INV2. Inverter INV2 is configured to output an output signal OUT. A latch loop 120 is configured to feedback output signal OUT to the input of inverter INV2. Latch loop 120 includes an inverter INV3 configured to receive output signal OUT. Latch loop 120 further includes a transmission gate 125 connected to an output of inverter INV3. Edge detector 110 is configured to selectively activate transmission gate 125 to interrupt feedback of output signal OUT to inverter INV2.

Input signal IN has an input logically high voltage level and an input logically low voltage level. Output signal OUT has an output logically high voltage level and an output logically low voltage level. A voltage level of the output logically high voltage level is greater than the input logically high voltage level. In some embodiments, the voltage level of the output logically high voltage level is twice the input logically high voltage level. A voltage level of the output logically low voltage level is greater than the input logically low voltage level. In some embodiments, the output logically low voltage level is equal to the input logically high voltage level. In some embodiments, a voltage swing of input signal IN is equal to a voltage swing of output signal OUT.

Voltage levels are shifted from the voltage levels of input signal IN to the voltage levels of the output signal OUT by INV1, C1, and INV2. The logically low voltage level of INV2 is set higher than that of INV1. The difference of the logically low voltage levels between INV2 and INV1 is stored in the first capacitor C1. The voltage levels at V1 and V2 nodes need to be set to logically low voltage levels before use to avoid malfunction. The output of inverter INV2 has the voltage levels corresponding to the voltage levels of output signal OUT.

First capacitor C1 prevents a direct connection of a direct current (DC) between inverter INV1 and inverter INV2. Preventing the direct connection of DC helps to reduce reliability concerns with respect to inverter INV2 by reducing a voltage swing experienced by transistors within the inverter. A capacitance of first capacitor C1 is greater than a layout dependent capacitance. The layout dependent capacitance is the capacitance resulting from parasitic effects within a layout design. In some embodiments, a capacitance of first capacitor C1 is in a range of tens of femto Farads (fF). In some embodiments, first capacitor C1 has a capacitance greater than about 20 fF. In some embodiments, first capacitor C1 has a capacitance ranging from about 40 fF to about 50 if. If the capacitance of first capacitor C1 is too low, level shifter 100 experiences an increased sensitivity to layout-dependent parasitic capacitors. If the capacitance of first capacitor C1 is too high, a size of level shifter 100 is increased without significant increase in performance.

Edge detector 110 is configured to selectively deactivate transmission gate 125 of latch loop 120 upon detecting a rising or falling edge of input signal IN. Edge detector 110 includes an input connected to the output of inverter INV1. Edge detector 110 includes two outputs. Each output of the two outputs is connected to transmission gate 125 to control conductivity of the transmission gate.

In some embodiments, level shifting apparatus 100 is positioned between input/output (I/O) circuitry and core circuitry. Write signals from the I/O circuitry pass through level shifting apparatus 100 to be processed by the core circuitry in which the signal voltage swing does not exceed the upper limit of the tolerable voltage levels for core devices. By selectively deactivating transmission gate 125, edge detector 110 helps to prevent contention between a current Iw induced by a received write signal through C1 from input signal IN and a current Ik through latch loop 120. Preventing contention between current Iw and current Ik helps to reduce a size of a driver as well as power consumption required by level shifting apparatus 100. Reducing a size of the driver in turn decreases an overall size of a device.

In some embodiments, a duration of an interruption of feedback through latch loop 120 ranges from about 5 picoseconds (ps) to about 10 ps. In some embodiments, the duration of the interruption is about 15 ps. The duration of the interruption is sufficiently long to permit the write signal to pass through level shifting device 100. The duration of the interruption is sufficiently short to help maintain a constant output by output signal OUT.

In comparison with other approaches, level shifting apparatus 100 is capable of maintaining a same voltage swing for both input signal IN and output signal OUT. Maintaining the same voltage swing permits formation of level shifting apparatus 100 with devices which have thin gate dielectric layers similar to the core circuitry. The thin gate dielectric layers reduce a size of devices in level shifting apparatus 100 in comparison with arrangements which include thicker gate dielectric layer devices. The smaller size of the devices also increases a switching speed of devices in level shifting apparatus 100 in comparison with devices which have thicker gate dielectric layers. In some embodiments, level shifting apparatus 100 is capable of operating at frequencies up to about 10 gigabits per second (Gb/s).

Level shifting apparatus 100 has dependence to the frequency of input signal IN. In some instances, level shifting apparatus 100 experiences attenuation of signals propagating through the level shifting apparatus as the frequency of input signal IN decreases. For example, as the frequency of input signal IN decreases, a voltage swing at the first side of first capacitor C1 will be smaller than that observed at the second side of the first capacitor increases, in some instances. Differences between first voltage V1 and second voltage V2 determine voltage shifting levels between voltages of input signal IN and output signal OUT.

Figure 2:
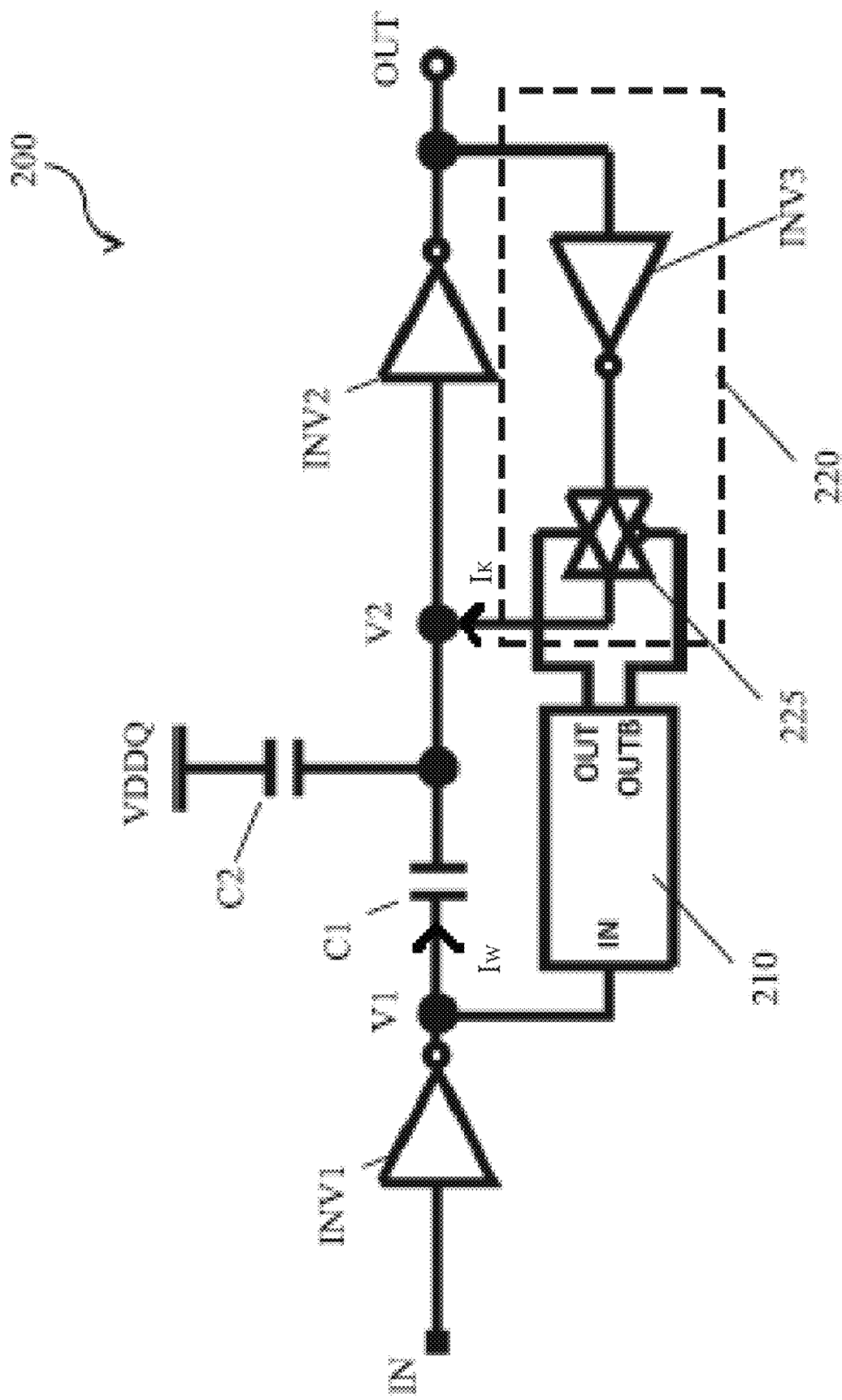
FIG. 2 is a schematic diagram of a level shifting apparatus in accordance with some embodiments.

FIG. 2 is a schematic diagram of a level shifting apparatus 200 in accordance with some embodiments. Similar devices in level shifting apparatus 200 have a same reference number as that for level shifting apparatus 100 increased by 100. In comparison with level shifting apparatus 100, level shifting apparatus 200 includes a second capacitor C2 connected to the second side of first capacitor C1. A first side of second capacitor C2 is configured to receive a voltage VDDQ. A second side of second capacitor C2 is connected to the second side of first capacitor C1. In comparison with level shifting apparatus 100, level shifting apparatus 200 is substantially free of signal attenuation due to the frequency of input signal IN.

Level shifting apparatus 200 includes second capacitor C2 which helps to control the second voltage V2 based on a capacitance ratio between first capacitor C1 and the second capacitor. Second voltage V2 is given by an equation:

$$V2 = \frac{(VDDQ * C2) + (V1 * C1)}{C1 + C2}$$

where VDDQ is a voltage level at the first side of second capacitor C2, C2 is a capacitance of the second capacitor, V1 is the voltage level at the first side of first capacitor C1, and C1 is a capacitance of the first capacitor. Second voltage V2 is substantially independent of the frequency of input signal IN which helps to maintain a precise relationship without frequency dependent attenuation between the voltage level of the input signal and the voltage level of output signal OUT.

In some embodiments, second capacitor C2 has a capacitance greater than about 20 fF. If the capacitance of second capacitor C2 is too low, level shifter 200 experiences an increased sensitivity to layout-dependent parasitic capacitance of the first capacitor and the second capacitor. If the capacitance of second capacitor C2 is too high, a size of level shifter 200 is increased without significant increase in performance. In some embodiments, the capacitance of first capacitor C1 in level shifting apparatus 200 is less than the capacitance of first capacitor C1 in level shifting apparatus 100 (FIG. 1).

Figure 3:
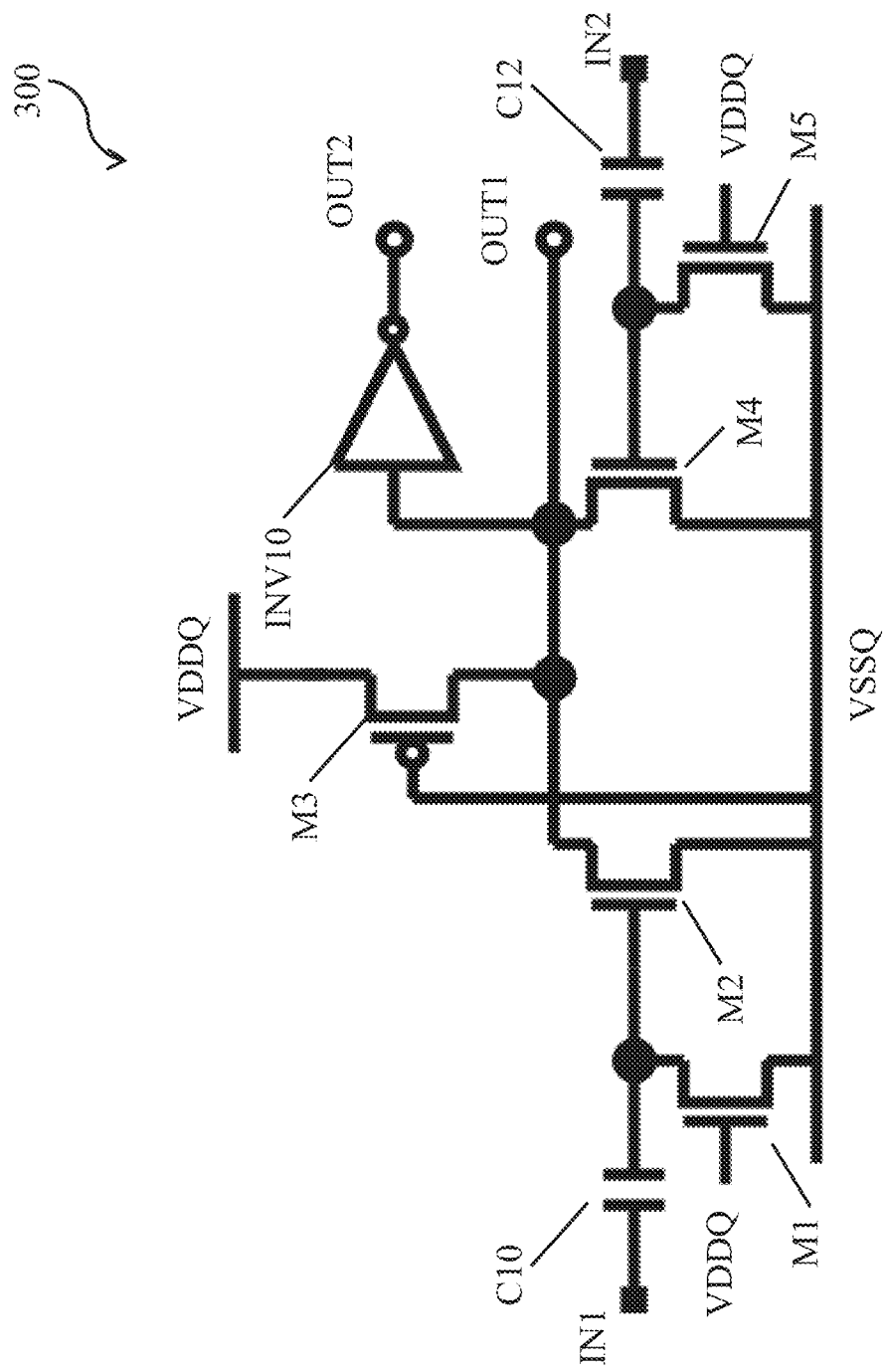
FIG. 3 is a schematic diagram of an edge detector in accordance with some embodiments.

FIG. 3 is a schematic diagram of an edge detector 300 in accordance with some embodiments. In some embodiments, edge detector 300 is part of a level shifting apparatus, such as level shifting apparatus 100 (FIG. 1) or level shifting apparatus 200 (FIG. 2). Edge detector 300 includes a first input IN1. A first input capacitor C10 is configured to receive an input signal from first input IN1. A first terminal of a transistor M1 is connected to a second side of input capacitor C10. A second terminal of transistor M1 is connected to a logically low voltage level VSSQ. A gate of transistor M1 is configured to receive a logically high voltage level VDDQ. The second side of first input capacitor C10 is also connected to a gate of a transistor M2. A first terminal of transistor M2 is connected to a first output OUT1. A second terminal of the transistor M2 is connected to logically low voltage level VSSQ. A gate of a transistor M3 is also connected to logically low voltage level VSSQ. A first terminal of transistor M3 is connected to logically high voltage level VDDQ. A second terminal of transistor M3 is connected to first output OUT1. A second input capacitor C12 is configured to receive an input signal from a second input IN2 at a first side of the second input capacitor. A second side of second input capacitor C12 is connected to a gate of a transistor M4. A first terminal of transistor M4 is connected to logically low voltage level VSSQ. A second terminal of transistor M4 is connected to first output OUT1. A first terminal of a transistor M5 is also connected to the second side of second input capacitor C12. A second terminal of transistor M5 is connected to logically low voltage VSSQ. A gate of transistor M5 is connected to logically high voltage VDDQ. An input of an inverter INV10 is connected to first output OUT1. An output of inverter INV10 is connected to a second output OUT2.

Edge detector 300 is configured to output a constant voltage level except when a rising or falling edge is present at first input IN1 or second input IN2. Edge detector 300 is configured to output logically high voltage level VDDQ unless the rising or falling edge is present. In some embodiments, edge detector 300 is configured to output logically low voltage level VSSQ unless the rising or falling edge is present.

Transistors M1, M3 and M5 are configured to be in a conductive state during an entire period of operation of edge detector 300. Transistor M1 being in a conductive state during the entire period of operation causes a voltage at the gate of transistor M2 to be logically low when no rising or falling edge is present. Transistor M5 being in a conductive state during the entire period of operation causes a voltage at the gate of transistor M4 to be logically low when no rising or falling edge is present. Transistor M3 being in a conductive state during the entire period of operation causes a voltage at first output OUT1 to be logically high and a voltage at second output OUT2 to be logically low when no rising or falling edge is present.

During operation, when a rising or falling edge is present at first input IN1, first input capacitor C10 causes a voltage at the gate of transistor M2 to rapidly increase. The rapid increase at the gate of transistor M2 causes transistor M2 to become conductive and connect first output OUT1 to logically low level VSSQ. As a result, the voltage level at first output OUT1 becomes logically low and the voltage level at second output OUT2 becomes logically high. A duration which first input capacitor C10 takes to stabilize a voltage at the gate of M2 ranges from about 0.5 ps to about 1.5 ps. In some embodiments, the duration which first input capacitor C10 takes to stabilize a voltage at the gate of M2 is about 1.0 ps. In some embodiments, first input capacitor C10 has a capacitance ranging from about 10 fF to about 50 fF. If the capacitance is too small, the conductive time of M2 will become too short to generate a sufficiently wide pulse to turn on/off the latch loop 120 in FIG. 1 or the latch loop 220 in the FIG. 2. If the capacitance is too large, a size of first input capacitor C10 is increased without significant increase in performance.

When a rising or falling edge is present at second input IN2, second input capacitor C12 and transistor M4 operate in a manner similar to that set forth above with respect to first input capacitor C10 and transistor M2. In some embodiments, a capacitance of second input capacitor C12 is equal to the capacitance of first input capacitor C10. In some embodiments, the capacitance of second input capacitor C12 differs from the capacitance of first input capacitor C10. In some embodiments, a size of transistor M4 is equal to a size of transistor M2. In some embodiments, the size of transistor M4 differs from the size of transistor M2.

Figure 4:
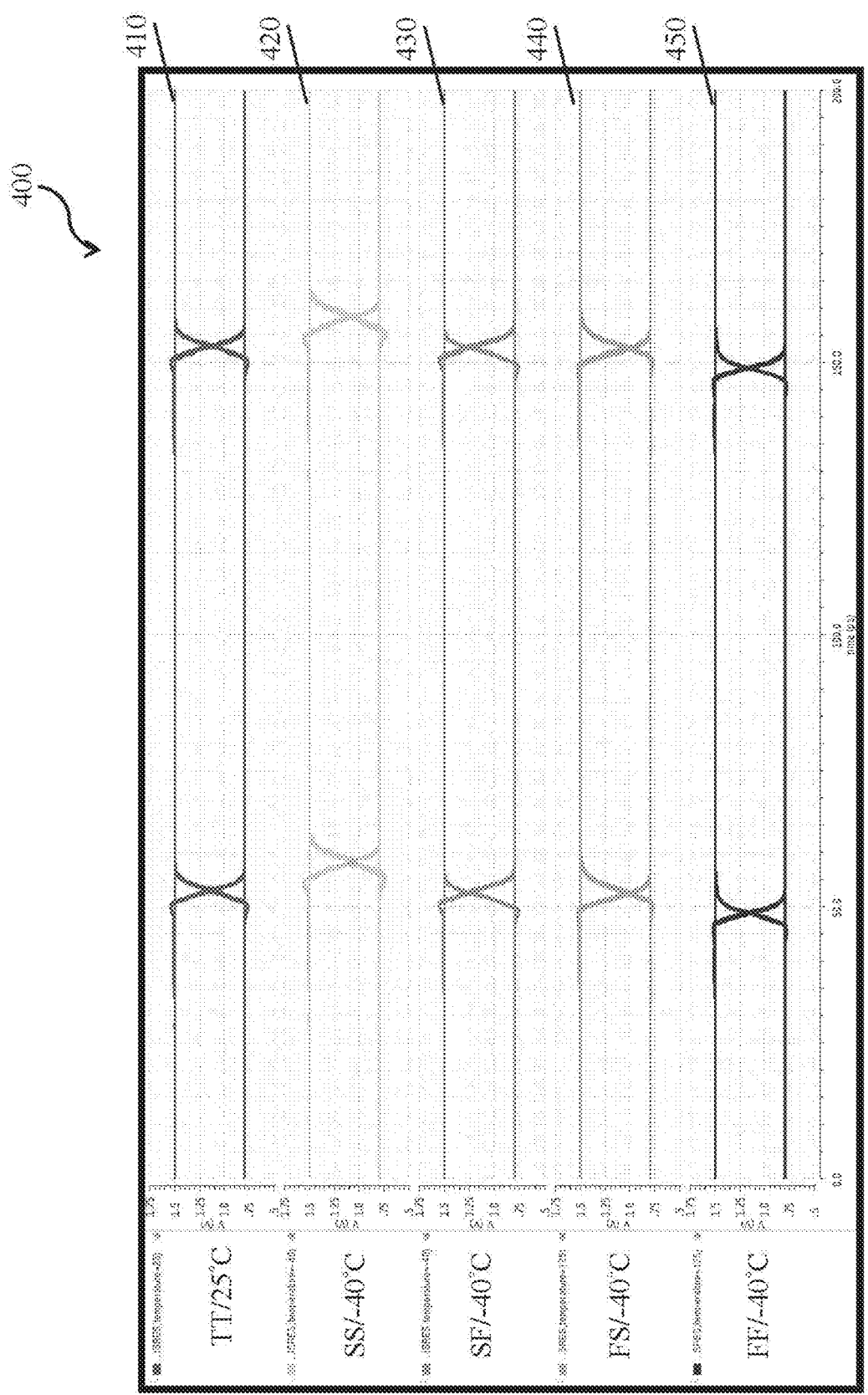
FIG. 4 is a graph of eye diagrams of a level shifting apparatus in accordance with some embodiments.

FIG. 4 is a graph 400 of eye diagrams at the speed of 10 Gbit/sec of a level shifting apparatus at various process and temperature skew corners in accordance with some embodiments. Graph 400 indicates a voltage output by the level shifting apparatus versus a time, in some embodiments. In some embodiments, the level shifting apparatus is level shifting apparatus 100 (FIG. 1) or level shifting apparatus 200 (FIG. 2). Graph 400 includes a plot 410 for transistors in the TT production corner at a temperature of 25° C. The production corner is a measure of switching performance of transistor due to unavoidable production variations. The TT production corner means that both n-type transistors and p-type transistors of the level shifting apparatus have a typical switching performance. In some embodiments, typical switching performance means an actual switching performance of a transistor matches a design switching performance within a predetermined threshold. Graph 400 includes a plot 420 for transistors in the SS production corner at a temperature of −40° C. The SS production corner means that both n-type transistors and p-type transistors of the level shifting apparatus have a slow switching performance. In some embodiments, slow switching performance means that an actual switching performance of a transistor is slower than the predetermined threshold less than the design switching performance. Graph 400 includes a plot 430 for transistors in the SF production corner at a temperature of −40° C. The SF production corner means that n-type transistors of the level shifting apparatus have a slow switching performance and p-type transistors have a fast slow switching performance. In some embodiments, fast switching performance means that an actual switching performance of a transistor is faster than the predetermined threshold greater than the design switching performance. Graph 400 includes a plot 440 for transistors in the FS production corner at a temperature of −40° C. The FS production corner means that n-type transistors of the level shifting apparatus have a fast switching performance and p-type transistors have a slow switching performance. Graph 400 includes a plot 450 for transistors in the FF production corner at a temperature of −40° C. The FF production corner means that both n-type transistors and p-type transistors of the level shifting apparatus have a fast switching performance.

Plots 410-450 all indicate a clean eye at 10 Gb/s, meaning that an amount of jitter in the voltage signal is small. For example, plot 410 indicates the level shifting apparatus has a jitter of about 0.5 ps. In another example, plot 420 indicates the level shifting apparatus has a jitter of about 0.75 ps. The low jitter values indicate that the level shifting apparatus is able to function with a very short interruption of a latch loop, e.g., latch loop 120 (FIG. 1) or latch loop 220 (FIG. 2), following a transition in a state of input signal IN.

Figure 5:
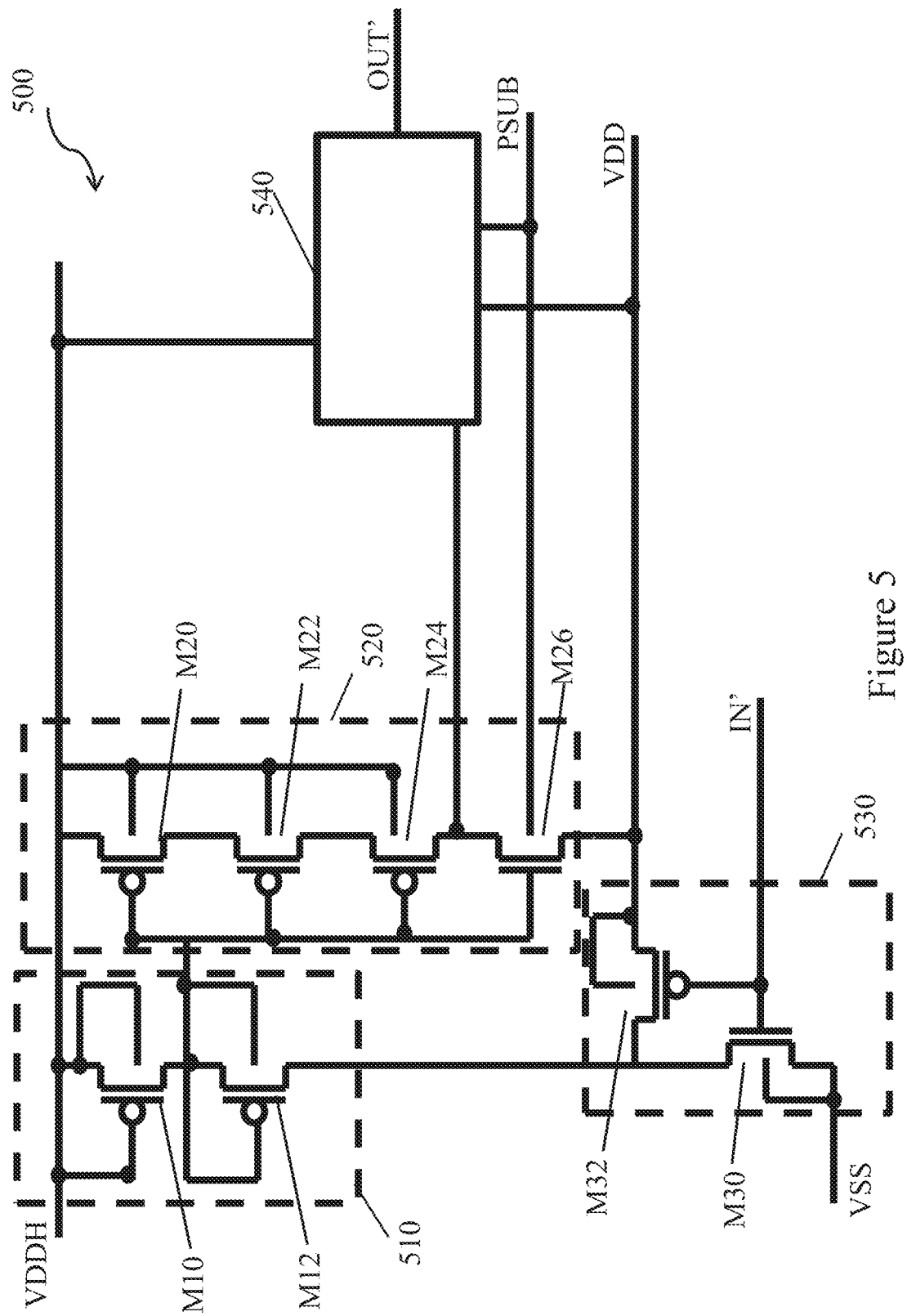
FIG. 5 is a schematic diagram of a level shifting apparatus in accordance with some embodiments.

FIG. 5 is a schematic diagram of a level shifting apparatus 500 in accordance with some embodiments. Level shifting apparatus 500 includes a leakage divider 510 connected to an upshifted logically high voltage VDDH. Level shifting apparatus 500 further includes a skew inverter 520 connected to the upshifted logically high voltage VDDH. Each of leakage divider 510 and skew inverter 520 are connected to an input region 530. A buffering element 540 is configured to receive an output of skew inverter 520. Buffering element 540 is also configured to receive the upshifted logically high voltage VDDH and an upshifted logically low voltage VDD. Buffering element 540 is also configured to receive a bias voltage PSUB. Based on the output of skew inverter 520, buffering element 540 is configured to output either upshifted logically high voltage VDDH or upshifted logically low voltage VDD.

Leakage divider 510 includes a transistor M10 connected in series with a transistor M12. A gate and a first terminal of transistor M10 is connected to an upshifted logically high voltage VDDH. A second terminal of transistor M10 is connected to a first terminal and a gate of transistor M12. A second terminal of transistor M12 is connected to input region 530. A bulk of transistor M10 is biased by up-shifted logically high voltage VDDH. A bulk of transistor M12 is biased by a voltage at the first terminal of transistor M12.

Skew inverter 520 includes a transistor M20 connected in series with a transistor M22, a transistor M24 and a transistor M26. A gate of each of transistors M20, M22, M24 and M26 is connected to the second terminal of transistor M10. A second terminal of transistor M24 is connected to a first terminal of transistor M26 and is configured to provide the output of skew inverter 520. A second terminal of transistor M26 is connected to input region 530. A bulk of each of transistors M20, M22 and M24 is biased by up-shifted logically high voltage VDDH. A bulk of transistor M26 is biased by bias voltage PSUB Input region 530 includes a transistor M30 having a first terminal configured to receive a non-shifted logically low voltage VSS. A second terminal of transistor M30 is connected to leakage divider 510 and to a first terminal of a transistor M32. A second terminal of transistor M32 is connected to skew inverter 520 and is configured to receive upshifted logically low voltage VDD. A gate of transistor 30 and a gate of transistor M32 are configured to receive an input signal IN'. A bulk of transistor M30 is biased by non-shifted logically low voltage VSS. A bulk of transistor M32 is biased by upshifted logically low voltage VDD.

Buffering element 540 is configured to receive the output of skew inverter 520 and output an output signal OUT' which has a voltage swing between upshifted logically high voltage VDDH and upshifted logically low voltage VDD. In some embodiments, buffering element 540 includes two inverters connected in series.

In operation, upshifted logically high voltage VDDH maintains transistor M10 in a non-conductive state during an entire period of operation of level shifting apparatus 500. Charge transfer across transistor M10 is a result of leakage current through transistor M10. Similarly, charge transfer across transistor M12 is also a result of leakage current across transistor M12.

Conductivity of skew inverter 520 is controlled based on the leakage current through leakage divider 510. When the voltage at the second terminal of transistor M10 is logically high, transistors M20, M22 and M24 are in a non-conductive state and transistor M26 is in a conductive state. As a result, the output of skew inverter 520 is connected to upshifted logically low voltage VDD. When the voltage at the second terminal of transistor M10 is logically low, transistors M20, M22 and M24 are in a conductive stated and transistor M26 is in a non-conductive state. As a result, the output of skew inverter 520 is connected to upshifted logically high voltage VDDH.

Input region 530 controls a leakage current across transistor M12. When input signal IN' is logically high, transistor M30 is in a conductive state and transistor M32 is in a non-conductive state. As a result, the second terminal of transistor M12 is connected to non-shifted logically low voltage VSS which increases the leakage current across transistor M12 which lowers the voltage at the second terminal of transistor M10 and activates transistors M20, M22 and M24. When input signal IN' is logically low, transistor M30 is in a non-conductive state and transistor M32 is in a conductive state. As a result, the second terminal of transistor M12 is connected to upshifted logically low voltage VDD which decreases the leakage current across transistor M12 which maintains a high voltage at the second terminal of transistor M10 and activates transistor M26.

Buffering element 540 buffers the logical output of skew inverter 520. When input signal IN' has a logically low voltage, buffer element 540 outputs upshifted logically low voltage VDD as output signal OUT'. When input signal IN' has a logically high voltage, buffer element 540 outputs upshifted logically high voltage VDDH as output signal OUT'. In some embodiments, the logically high voltage for input signal IN' is equal to upshifted logically low voltage VDD. In some embodiments, upshifted logically high voltage VDDH is equal to twice the logically high voltage of input signal IN'. A trip point for buffering element 540 is tunable by adjusting a size of at least one transistor M20, M22, M24 or M26 of skew inverter 520.

In comparison with level shifting apparatus 100 (FIG. 1) or level shifting apparatus 200 (FIG. 2), level shifting apparatus 500 is free of capacitors. As a result, level shifting apparatus 500 has a smaller chip size than level shifting apparatus 100 or level shifting apparatus 200. In some embodiments, level shifting apparatus 500 is usable for lower speed applications than level shifting apparatus 100 or level shifting apparatus 200. In some embodiments, level shifting apparatus 500 is operated at a switching speed on the order of megabytes per second (MB/s). In some embodiments, the switching speed of level shifting apparatus ranges from about 10 Mb/s to about 20 Gb/s.

Figure 6:
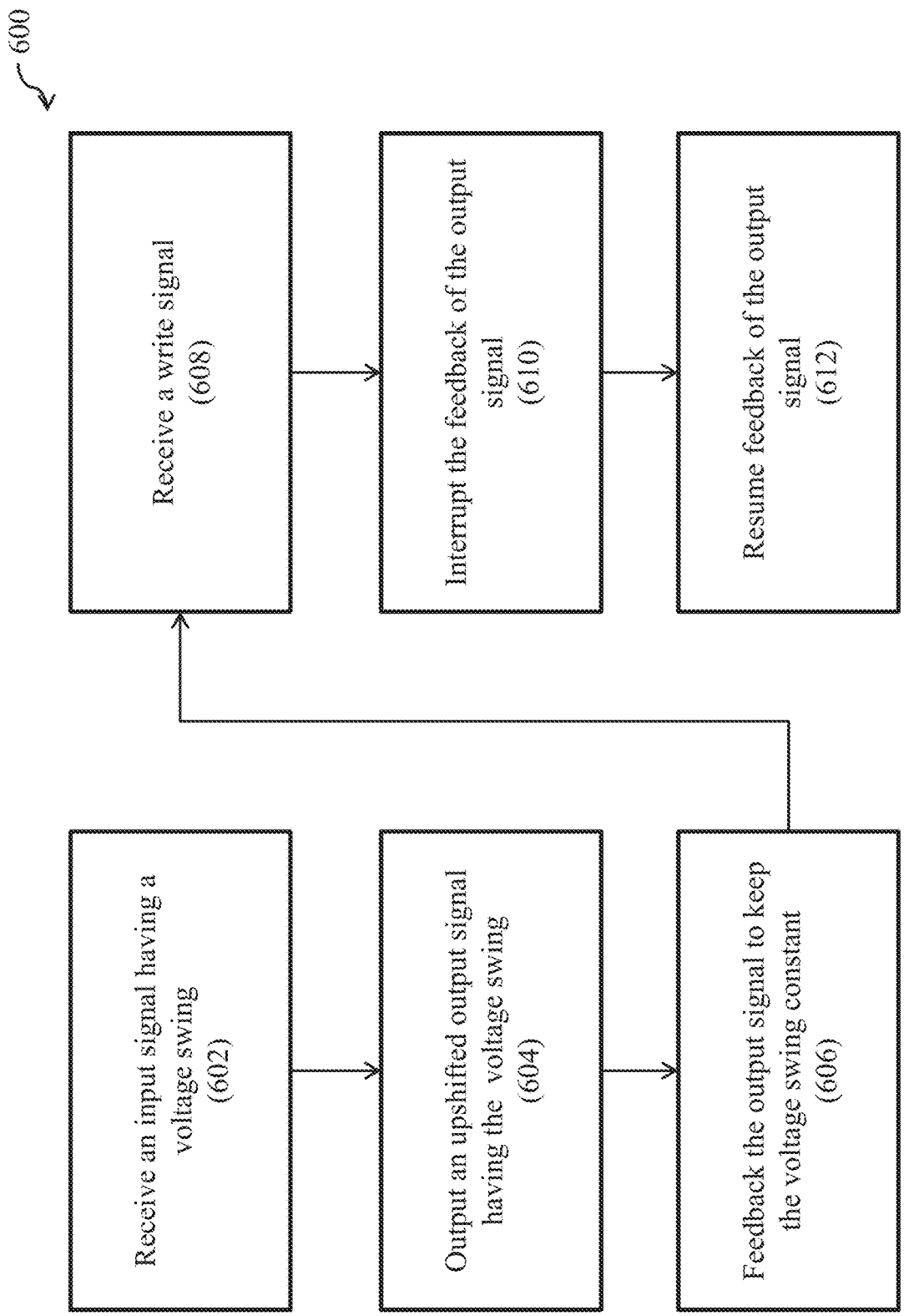
FIG. 6 is a flow chart of a method of using a level shifting apparatus in accordance with one or more embodiments.

FIG. 6 is a flow chart of a method 600 of using a level shifting apparatus in accordance with one or more embodiments. Method 600 begins with operation 602 in which the level shifting apparatus receives an input signal. The input signal, e.g., input signal IN (FIGS. 1 and 2), has a voltage swing. For example, in some embodiments, the voltage swing is from a logically low voltage of about 0V to a logically high voltage of about 0.8V, for a voltage swing of about 0.8V.

In operation 604, an upshifted output signal is output. The upshifted output signal, e.g., output signal OUT (FIGS. 1 and 2), has a higher voltage level in comparison with the input signal. A logically high voltage of the output signal is higher than a logically high voltage of the input signal. In addition, a logically low voltage of the output signal is higher than a logically low voltage of the input signal. A voltage swing of the output signal is substantially equal to the voltage swing of the input signal. For example, in some embodiments, the logically low voltage of the output signal is about 0.8 V and the logically high voltage of the output signal is about 1.6V, for a voltage swing of about 0.8V. In some embodiments, the logically low voltage of the output signal is equal to the logically high voltage of the input signal. In some embodiments, the logically high voltage of the output signal is equal to twice the logically high voltage of the input signal.

In operation 606, the output signal is fed back within the level shifting apparatus to maintain a constant voltage swing. Maintaining a constant voltage swing helps to reduce the risk of damage to devices within the level shifting apparatus and other circuitry connected to the level shifting apparatus. In some embodiments, the output signal is fed back using a latch loop, e.g., latch loop 120 (FIG. 1) or latch loop 220 (FIG. 2).

In operation 608, the level shifting apparatus receives a write signal. The write signal includes a transition of the input signal IN from one logic state to another.

In operation 610, the feedback of the output signal is interrupted. The feedback signal is interrupted to help avoid contention between a current generated by the transition of the input signal and a current through the feedback. Interrupting the feedback signal results in less power consumption because a size of a driver associated with the level shifting apparatus is decreased with respect to methods which do not interrupt the feedback. In some embodiments, the feedback signal is interrupted using an edge detector, e.g., edge detector 110 (FIG. 1), edge detector 210 (FIG. 2) or edge detector 300 (FIG. 3).

In operation 612, the feedback of the output signal is resumed. Following an interruption duration, the feedback of the output signal is resumed to once again maintain the voltage swing. In some embodiments, the interruption duration ranges from about 0.5 ps to about 1.5 ps. In some embodiments, the interruption duration is about 1 ps. In some embodiments, the feedback signal is resumed using an edge detector, e.g., edge detector 110 (FIG. 1), edge detector 210 (FIG. 2) or edge detector 300 (FIG. 3).

One of ordinary skill in the art would recognize that additional operations are able to be included in method 600 without departing from the scope of this description. One of ordinary skill in the art would also recognize that an order of operation of the above described operations is able to be changed without departing from the scope of this description.

In some embodiments, an edge detector includes an output node selectively coupled to a first voltage node through a first transistor, the first voltage node having a first voltage level, a second transistor configured to continuously couple the output node to a second voltage node having a second voltage level, and a capacitor including a first terminal coupled to a gate of the first transistor and a second terminal configured to receive an input signal.

In some embodiments, an edge detector includes an output node selectively coupled to a first voltage node through at least one of a first transistor or a second transistor, the first voltage node having a first voltage level, a third transistor configured to continuously couple the output node to a second voltage node having a second voltage level, a first capacitor including a first terminal coupled to a gate of the first transistor and a second terminal configured to receive a first input signal, and a second capacitor including a first terminal coupled to a gate of the second transistor and a second terminal configured to receive a second input signal.

In some embodiments, a method of detecting an edge of a signal includes coupling an output node of an edge detector to a first voltage node through a first transistor, receiving the signal at a first terminal of a capacitor, in response to an edge of the signal at the first terminal of the capacitor, increasing a voltage at a gate of a second transistor coupled to a second terminal of the capacitor, and, in response to the increased voltage, coupling the output node to a second voltage node through the second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An edge detector comprising:
an output node selectively coupled to a first voltage node through a first transistor, the first voltage node having a first voltage level;
a second transistor configured to continuously couple the output node to a second voltage node having a second voltage level; and
a capacitor comprising a first terminal coupled to a gate of the first transistor and a second terminal configured to receive an input signal.

2. The edge detector of claim 1, wherein, responsive to an edge in the input signal, the first transistor is configured to become conductive for a predefined duration.

3. The edge detector of claim 2, wherein, responsive to the first transistor becoming conductive, the output node is configured to have the first voltage level.

4. The edge detector of claim 2, wherein the predefined duration has a value ranging from 0.5 picoseconds (ps) to 1.5 ps.

5. The edge detector of claim 1, wherein
the first voltage level is a logically low voltage level, and
the second voltage level is a logically high voltage level.

6. The edge detector of claim 1, wherein
the first transistor is an n-type transistor, and
the second transistor is a p-type transistor.

7. The edge detector of claim 1, wherein a gate of the second transistor is configured to receive the first voltage level.

8. The edge detector of claim 1, further comprising a third transistor coupled between the gate of the first transistor and the first voltage node, wherein a gate of the third transistor is configured to receive the second voltage level.

9. The edge detector of claim 1, wherein the capacitor has a capacitance ranging from 10 femto-Farads (fF) to 50 fF.

10. The edge detector of claim 1, further comprising an inverter, the inverter comprising an input terminal coupled to the output node.

11. The edge detector of claim 1, wherein
the edge detector is positioned between input/output (I/O) circuitry and core circuitry, and
the edge detector comprises devices having thin gate dielectric layers similar to thin gate dielectric layers of devices in the core circuitry.

12. An edge detector comprising:
an output node selectively coupled to a first voltage node through at least one of a first transistor or a second transistor, the first voltage node having a first voltage level;
a third transistor configured to continuously couple the output node to a second voltage node having a second voltage level;
a first capacitor comprising a first terminal coupled to a gate of the first transistor and a second terminal configured to receive a first input signal; and
a second capacitor comprising a first terminal coupled to a gate of the second transistor and a second terminal configured to receive a second input signal.

13. The edge detector of claim 12, wherein
responsive to an edge in the first input signal, the first transistor is configured to become conductive for a first predefined duration, and
responsive to an edge in the second input signal, the second transistor is configured to become conductive for a second predefined duration.

14. The edge detector of claim 13, wherein, responsive to at least one of the first transistor or the second transistor becoming conductive, the output node is configured to have the first voltage level.

15. The edge detector of claim 12, further comprising:
a fourth transistor coupled between the gate of the first transistor and the first voltage node, wherein a gate of the fourth transistor is configured to receive the second voltage level; and
a fifth transistor coupled between the gate of the second transistor and the first voltage node, wherein a gate of the fifth transistor is configured to receive the second voltage level.

16. A method of detecting an edge of a signal, the method comprising:
- coupling an output node of an edge detector to a first voltage node through a first transistor;
- receiving the signal at a first terminal of a capacitor;
- in response to an edge of the signal at the first terminal of the capacitor, increasing a voltage at a gate of a second transistor coupled to a second terminal of the capacitor; and
- in response to the increased voltage, coupling the output node to a second voltage node through the second transistor.

17. The method of claim 16, wherein the coupling the output node to the second voltage node through the second transistor comprises coupling the output node to the second voltage node for a duration based on a capacitance of the capacitor.

18. The method of claim 16, wherein the coupling the output node to the second voltage node through the second transistor causes the output node to have a voltage level of the second voltage node.

19. The method of claim 16, further comprising coupling the gate of the second transistor to the second voltage node through a third transistor.

20. The method of claim 16, wherein the signal is a first signal, the capacitor is a first capacitor, and the method further comprises:
- receiving a second signal at a first terminal of a second capacitor;
- in response to an edge of the second signal at the first terminal of the second capacitor, increasing a voltage at a gate of a third transistor coupled to a second terminal of the second capacitor; and
- in response to the increased voltage at the gate of the third transistor, coupling the output node to the second voltage node through the third transistor.

* * * * *